US006883087B1

(12) United States Patent
Raynaud-Richard et al.

(10) Patent No.: US 6,883,087 B1
(45) Date of Patent: Apr. 19, 2005

(54) PROCESSING OF BINARY DATA FOR COMPRESSION

(75) Inventors: Pierre Raynaud-Richard, San Mateo, CA (US); Cyril Meucillon, Redwood City, CA (US); Jean-Baptiste Quéru, Millbrae, CA (US)

(73) Assignee: Palm, Inc., Santa Clara, CA (US)

( * ) Notice: Subject to any disclaimer, the term of this patent is extended or adjusted under 35 U.S.C. 154(b) by 613 days.

(21) Appl. No.: 09/738,832

(22) Filed: Dec. 15, 2000

(51) Int. Cl.[7] .......................... G06F 9/30; G06F 9/318; G06F 13/40
(52) U.S. Cl. ................ 712/213; 712/224; 712/225; 712/300; 710/68
(58) Field of Search ................ 712/213, 224, 712/225, 300, 201, 206, 210, 223, 226; 710/68; 711/213, 216; 717/163, 159, 136; 715/532

(56) References Cited

U.S. PATENT DOCUMENTS

| | | | |
|---|---|---|---|
| 4,168,513 A | | 9/1979 | Hains et al. |
| 4,464,650 A | | 8/1984 | Eastman et al. |
| 4,558,302 A | | 12/1985 | Welch |
| 4,847,619 A | | 7/1989 | Kato et al. |
| 5,673,209 A | | 9/1997 | Heiney et al. |
| 5,794,010 A | | 8/1998 | Worrell et al. |
| 5,822,787 A | * | 10/1998 | Zucker ........................ 711/213 |
| 5,915,098 A | | 6/1999 | Palmer et al. |
| 5,946,484 A | * | 8/1999 | Brandes ...................... 717/136 |
| 6,047,298 A | | 4/2000 | Morishita |
| 6,199,126 B1 | | 3/2001 | Auerbach et al. |
| 6,339,820 B1 | * | 1/2002 | Baentsch et al. ........... 712/209 |
| 6,367,012 B1 | * | 4/2002 | Atkinson et al. ........... 713/176 |

OTHER PUBLICATIONS

International Search Report–PCT/US01/48746, Apr. 1, 2002.
Lefurgy, Charles et al., Improving Code Density Using Compression Techniques, IEEE, 1997, p. 195.
Araujo, Guido et al., Code Compression Based on Operand Factorization, IEEE, 1998, Section 3.
Lefurgy, Charles et al, Evaluation of a High Performance Code Compression Method, IEEE, Nov. 16–18, 1999, Section 3.
Conte, Thomas M. et al., Instruction Fetch Mechanisms for VLIW Architectures with Compressed Encodings, IEEE, 1996.
Lefurgy, Charles et al., Reducing Code Size with Run–Time Decompression, IEEE, Jan. 8–12, 2000.
"x86 Glossary of Terms", Quantasm Corporation, (http://www.quantasm.com/gloss.html).
"Intel Architecture Software Developer's Manual", Intel Corporation, 1999, vol. 2.

\* cited by examiner

*Primary Examiner*—Daniel H. Pan
(74) *Attorney, Agent, or Firm*—Blakely, Sokoloff Taylor & Zafman LLP

(57) ABSTRACT

Binary data is processed and organized by determining patterns specific for the binary data in a software package. Code sections may be split from an instruction according to the code section type or behavior. Certain of these code sections may be organized into specialized ordered lists. Furthermore, some code sections may be abbreviated and sections deleted. Dictionaries are used to store references for or values of the code sections. The processed data may be useful in subsequent compression techniques. In addition, other aspects of the present invention relating to the reducing the size and/or ordering the form of the binary data are described.

44 Claims, 13 Drawing Sheets

| ENTRY (INDEX) | PREFIX | OPCODE | MODR/M | PARAMETER TYPE | ANALYSIS DATA |
|---|---|---|---|---|---|
| 1 | | 01 | | IMM1, OFFSET 4, SIB | |
| 2 | | 02 | | IMM1, OFFSET 4, SIB | |
| 3 | 0 X 64 | 02 | 0X6E | IMM1, OFFSET 2 | |
| 4 | 0 X 64, 0 X 66 | 02 | 0X6E | IMM1, OFFSET 2 | |
| 5 | | 01 | 0X6E | IMM2, OFFSET 4 | |

FIG. 3A

| INDEX | EXTENDED OPCODE | PARAMETER LIST INDEX |
|---|---|---|
| 1 | 01 | 1, 7, 9 |
| 2 | 02 | 1, 7, 9 |
| 3 | 64, 02, 6E | 1, 6 |
| 4 | 64, 66, 02, 6E | 1, 6 |
| 5 | 01, 6E | 2, 7 |

FIG. 3B

1
$IMM_1^1$
$IMM_1^1$
$IMM_1^1$
$IMM_1^1$

6
$OFFSET_3^2$
$OFFSET_4^2$

7
$OFFSET_1^4$
$OFFSET_2^4$
$OFFSET_5^4$

9
$SIB_1$
$SIB_2$

2
$IMM_5^2$

FIG. 3C

| ENTRY (INDEX) | SYMBOL NAME | ABBREVIATION | USED? |
|---|---|---|---|
| A | FOO | 1,1 | X |
| B | VOID | 1,2 | X |
| C | BAR | 1,3 | |
| D | FED | 1,4 | |
| E | MAIN | 1,5 | X |

FIG. 6

PROCESSING OF BINARY DATA FOR COMPRESSION

NOTICE OF COPYRIGHT

A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention relates generally to processing and organizing binary code, and more particularly to processing and organizing binary code based on patterns in instructions of a binary data set.

BACKGROUND

There are a large variety of software programs that are currently in existence and or being developed to direct computer systems in performing countless tasks. In particular, commercial software products are available that include one or more application. For example, word processors, spreadsheets, and database management systems are applications software. Some products also combine an operating system and may be used to deliver services without requiring any additional software once installed on the computer's hardware platform.

Generally, software products include a set of files with binaries and data, e.g. raw facts. The binaries alone, i.e. strings of 0's and 1's, exclusive of the data, of the software product are considered a software package. These binaries are in an executable file (also referred to as binary data file) containing a program that is capable of being executed by a computer. Unlike a source file, an executable file has binaries and is not readable by humans. To transform a source file into an executable file, the file contents must be passed through a compiler, interpreter or assembler. It is these binaries that fill a computer's memory.

The executable file may store a list of instructions, data, information for a dynamic linking and/or information for debugging. An instruction part of an executable file is a basic operation, composed of an operation code (hereinafter referred to as "opcode") and optionally one or more parameters.

The executable file may also include one or more symbols that reference resources inside of the file. Often, there are multiple binaries that need to work together at execution time. For example, in modular system environments both the operation system layer and the application layer are split into kernel, drivers, applications, shared libraries and/or plug-in's. Each binary publishes a list of symbol names (i.e. stream of bytes of variable lengths) as unique identifiers to be used for dynamic linking, where symbols exported by one binary are matched with symbols imported by another binary. Exported symbols indicate resources defined in the file and are made visible to other files, whereas imported symbols are not defined in the file, but may be found in other files.

There are several concerns inherent to executable files. One issue is that executable files often consume an enormous amount of storage space within the system. Thus, it is desirable to reduce the information that is stored on the computer systems. Reducing the storage footprint of information is among the oldest challenges to software engineering.

Although the rapid pace of technological progress provides us with relatively inexpensive and large storage devices, the storage spaces are not always large enough for the desired amount of information. The human imagination will always find ways to develop software with requirements that exceed hardware capabilities and consequently increasing the need to more efficiently store information.

As a result of the demand to shrink files, there is much interest in a variety of compression techniques, such as loss-less compression. Loss-less compression is the art of reducing the storage size of data without losing any information. Loss-less compression tools are designed to recognize common patterns from a general pool of data, but are not drawn to make assumptions based on specific properties and regularities of the data source.

Compression schemes are most efficient when the binaries have certain distinctions. If the binaries exhibit well-defined characteristics, then a compression scheme that is most suited to the characteristic may be chosen. Typically, software packages use a specific binary file format, for a specific processor, as generated by a particular compiler or linker tool. However, most binaries have a combination of characteristics, making it difficult to select a suitable compression scheme.

Where information is decomposed into its constituents, the coding technique best suited to each constituent may be applied to improve compression performance. Unfortunately, prior techniques do not efficiently process and organize binary code because individual slices of a file are compressed without considering the contents of the file as a whole. Usually, the context of each slice is too small to determine repetitions or patterns that may be useful in optimizing compression.

Furthermore, patterns exist between multiple files, as well as inside of a single binary. However, previous compression schemes do not leverage these patterns between binaries to allow global optimization between multiple binaries. These prior systems also do not extract language specific information. Nor do these other systems eliminate sections that are not required to load the executable file into memory, e.g. debugging information, etc. Thus, the stored files contain information that needlessly consumes precious space within a device.

It is often thought that the specific structure of each executable file needs to be respected because it is assumed that random access will be required to read and write the contents of an uncompressed binary file. Traditional approaches to file compression are based on this presumption that files may need to be read from or written to at any random position, on any length, and in any order.

On the contrary, to this assumption that random access is necessary, many executable files are only read from or written to in one block. Furthermore, these files are only written once, at the time of creation, and will never be modified after development. They will only be deleted or fully replaced by updated versions. These fixed files will always be passed to a binary loader as one raw block of data and placed into memory in one operation by the loader. Thus, the structure of a fixed executable file need not be preserved but may be processed and reorganized without compromising the utility of the binaries.

Another problem with executable files is that they may be susceptible to persons maliciously breaking into a computer system. There are many individuals who possess sufficient technical knowledge to understand the weak points in a security system. It is of crucial importance that executable files provide security measures that deter hackers from gaining unauthorized access to computer systems for the purpose of stealing or corrupting data.

In light of the shortcomings of the various currently available systems, there is still a need for optimization of compression across multiple binaries of a software package. In particular, there is an interest for a compression system that organizes the contents of binaries according to patterns and eliminates unnecessary sections. Moreover, the system should provide security measures to reduce vulnerability to hackers or crackers.

SUMMARY OF THE INVENTION

Binary data is processed and organized binary data according to methods described herein. In one embodiment, an extended opcode, e.g. opcode and prefix, ModR/M, etc., from an instruction is split and an index code is stored in an opcode list in the order that the instruction is provided in an instruction stream. The index code is a reference to an instruction entry in an instruction format dictionary representing the extended opcode. Where a specific extended opcode is not already included in the instruction format dictionary, the extended opcode may be added as an instruction entry in the dictionary. In some cases, particular types e.g. immediate value, an offset, a register index, etc., of parameters in the instruction may be identified. Those parameters may be split and stored into parameter lists for the particular type.

In another embodiment, a parameter of the instruction, if any are present in the instruction, is considered to identify a similar use property of the parameter, e.g. size, sign, number of bits required to store the parameter, module $2^n$ class, etc. The identified parameter may be split from the parameter list and/or instruction, and stored the parameter in a sub-list for the similar use property. Rules that are specific to the binary data may be used in the consideration of parameter behavior. These rules may be formulated by statistical analysis of the parameters of a particular type in the entries of the instruction format dictionary. The dictionary may be update with this information.

In other cases, parameters are considered to identify a random use property of the parameter. Once a parameter is specified as having a random use property, the parameter may be split and stored in a dissimilar sub-list for the random use property. Furthermore the dictionary may be update with this information.

In still other embodiments, the binary data includes dynamic link symbol and a symbol name corresponding to the dynamic link symbol. The symbol name may be replaced with an abbreviation that is smaller than the symbol name. This abbreviation and symbol name is written into a symbol dictionary as an entry. Where new dynamic link symbols are found, they may be added to the symbol dictionary. At times, an exception symbol name that is directly accessed by an executable during execution is found in the instruction and is published.

In an embodiment of the present invention, unused symbols that are export by the executable file and not to import by another executable file are identified. These unused symbols names may be written into the symbol dictionary and eliminated from the binary data. Such unused symbols may be marked as unused in the symbol dictionary. Where an eliminated symbol needs to be reinstated, the symbol dictionary may be used to generate the symbol.

Any of these procedures may be employed by processing system which may further compress the organized data. A de-processing system may convert the data into a usable form. Furthermore, the methods may be implemented by a computer readable medium.

The benefits of the present invention include permitting reduced storage footprint of binaries. Furthermore, the vulnerability to external hackers may be also lessened. Other features and advantages of these and other embodiments are discussed in detail below.

BRIEF DESCRIPTION OF THE DRAWINGS

The present invention is illustrated by way of example, and not limitation, in the figures of the accompanying drawings in which:

FIGS. 1A and 1B are block diagrams systems for use with the methods described below, wherein FIG. 1A represents one processing system and FIG. 1B depicts one user computational system.

FIGS. 2A and 2B are flow charts of various stages of processing sections of binary data in accordance with the teachings presented below, wherein FIG. 2A shows the splitting of code sections, and FIG. 2B shows analyzing and organizing code.

FIGS. 3A, 3B and 3C are tables of dictionaries with opcode information, wherein FIG. 3A represents of one instruction format dictionary, FIG. 3B represents a subset dictionary, according to the present invention, and FIG. 3C represents ordered lists.

FIGS. 5A and 5B are flow charts of various stages of processing symbols in binary data in accordance with the teachings presented below, wherein FIG. 5A shows renaming of exported symbols, and FIG. 5B shows renaming of imported symbols.

FIG. 6 is a table representation of one symbol dictionary, according to the present invention.

FIGS. 7A and 7B are flow charts of various stages of processing binary data in accordance with the teachings presented below, wherein FIG. 7A shows marking the used imported symbols in a dictionary, and FIG. 7B shows eliminating unused exported symbols.

DETAILED DESCRIPTION

Figure 1A:
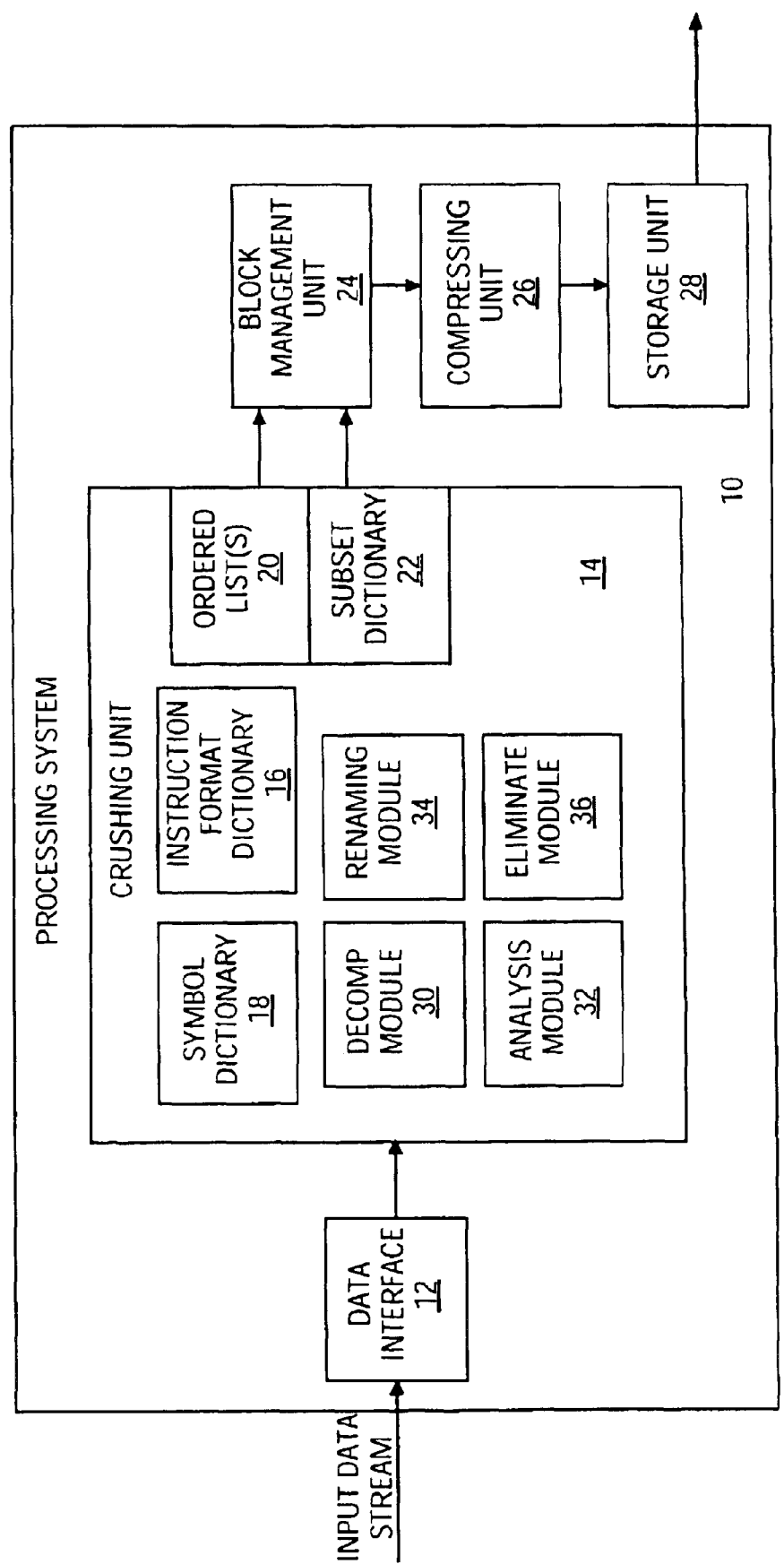

The present invention provides for the processing and organizing of binaries in executable file(s) of a software package specific to an environment. The resulting data is reduced in size and/or presented in a more regular form than the original data stream. Furthermore, the processed data may be useful in subsequent compression techniques. The more ordered nature of the data processed by the current invention lends itself to be reduced by known compression tools to a smaller size than an unprocessed instruction stream.

According to the present invention, the components of a software package are considered and the regularities of the binary data are leveraged to determine patterns specific for the binary data. The various software package components include assembly code/binary; strings of dynamic links, e.g. names, software programs, variables; relocation tables, e.g. pointer, index; hash table for string access; and other specific structures. Various of these components, e.g. opcode, parameters, etc., may be extracted from an instruction and arranged into ordered lists. A dictionary is employed to reference these components. A dictionary may also assist in reducing some components, e.g. symbols, to abbreviated bit code. Furthermore, unnecessary code sections, e.g. unused symbols, hash tables, etc. may be eliminated.

The binary data that is processed by the present invention may take numerous forms. Some common formats include elf binary format for an x86 CPU architecture (from Intel Corporation of Santa Clara, Calif.) and other architectures, PE for Microsoft architectures, PEF for architectures based on an Apple computer system, and the like. The binary data is often generated by a particular translating tool, e.g. compiler or linker, for a specific processor. For example, data having an elf binary format that is generated by a gcc compiler/linker tool set for x86, may be used.

The original binary data is provided by a data source to a processing system for manipulation. The data source may be any type of device that generates binary data or data signals related to the binary data. For instance, the data source may be a compiler, a linker, or a computer that produces source code for conversion to object code. In one embodiment, the processing system receives raw data and includes a compiler and/or linker for converting code into computer readable form.

The processing system that manipulates the binary data, according to the present invention, is any electronic device to receive data and manipulate the data to generate a processed binary data in the manner described herein, e.g. a computer system or workstation. In one embodiment, the computational system includes a platform, e.g. a personal computer (PC), such as a Macintosh® (from Apple Corporation of Cupertino, Calif.), any PC based on Windows® (from Microsoft Corporation of Redmond, Wash.), or one of a wide variety of hardware platforms that runs the UNIX operating system or other operating systems. The system may also be other intelligent devices, such as telephones, e.g. cellular telephones, personal organizers (PDA's), pagers, and other wireless devices. The devices listed are by way of example and are not intended to limit the choice of apparatuses that are or may become available in the computational device field that may process and convey information, as described herein.

One example of a processing system 10 for processing binary data files according to the present invention is shown in FIG. 1A. The processing system 10 has components for handling data in various ways. These components include a data interface 12 to receive newly acquired data and a crushing unit 14 for processing and organizing the data. The crushing unit 14 includes at least one dictionary, such as an instruction format dictionary 16 and/or symbol dictionary 18, for storing a database to the data. The crushing unit 14 further includes at least one ordered list 20 and optionally a subset dictionary 22. The processing system may also have several optional components, such as a block management unit 24, compressing unit 26, and at least one storage unit 28 for retaining (i.e., storing) the data.

The crushing unit 14 condenses the data and/or organizes the data into a more regular form. One or more modules are present in the crushing unit for performing one or more of the processing procedures. FIG. 1A shows one such crushing unit that has a decomposition module 30 for splitting code sections by type or behavior, analysis module 32 for splitting code sections by behavior, renaming module 34 for abbreviating code sections and elimination module 36 for deleting code sections. Any one or all of these modules may be provided in a crushing unit, depending on the processes performed by the crushing unit. The scope of the present invention anticipates that each of these procedures may be performed alone or in various combinations and not necessarily in the order in which they are described below. For example, a system may provide for decomposition alone, or in combination with analysis, renaming and/or elimination procedures. Similarly, a system may include analysis alone or in combination with decomposition, renaming and/or elimination procedures. Likewise, renaming may be performed alone or along with decomposition, analysis and/or elimination steps. Correspondingly, elimination may only occur or in conjunction with decomposition, analysis and/or renaming. The techniques may be performed on a binary data file taken as a single block to optimize compression across multiple binaries of a software package.

Decomposition of Binary Data File Component

The crushing unit 14 may include a decomposition module 30 to breakdown certain sections of a provided instruction. Each instruction, expressed as a stream of bytes, included in a binary data file is comprised of an opcode and at times other components, such as one or more parameter, Mod/RM, prefix, etc. The instruction may be processed according to the present invention, as shown in the flow charts in FIGS. 2A and 2B by decomposing the instruction components into ordered lists. The resulting storage footprint of the binaries is significantly reduced by the decomposition steps.

An instruction format dictionary is presented, or if the dictionary does not yet exist, it is created by using a published set of language descriptions based on the syntax of the specific instruction language. This language specific information is typically provided by the author of the instruction language, such as in a data book. See Intel Architecture Software Developer's Manual (1999). The set of language descriptions may contain millions of descriptions. In order to generate the dictionary, the descriptions that apply to the binary code of the particular software package being processed are identified by comparing the each instruction of the binary file with the language descriptions. Each applicable language description forms a rule in a set of rules that is used to process the binary data. As a result, the set of rules contains substantially fewer entries than the original set of descriptions, such as 15–20 thousand entries in the rule set compared to 2–3 million entries in the description set.

Other case-specific language information may be extracted to form rules by knowledge of the language as well as the appropriate translation tool, e.g. compiler, and processor, with which the binary data is designed to work. Examples of some of these rules include a jump table, e.g. switch table; a pointer to other instructions, or a function call that does not point to any specific location but rather points to a particular known function; a "grab" instruction that creates a pointer on global variables, and will use an apparently random offset that, in truth, can be calculated, and so doesn't need to be kept during storage. The foregoing are only examples of rules presented for illustration purposes. Those skilled in the art would be able to create other rules based on the particular software package being processed with knowledge of the software language employed.

Typically, the instruction format dictionary is shared between all of the binaries of a software package. In some embodiments, a second instruction format dictionary is created to store additional instructions that are not found as entries in the main instruction format dictionary. Such secondary dictionary may be formed during the course of processing the binary data. The second dictionary may be embedded in an output file having the processed data. Through use of the second dictionary, incremental additions and modifications to the main dictionary may be stored. In other embodiments, the main instruction format dictionary may be directly modified or entries added.

The dictionary has a plurality of entries, where each entry is for a specific extended opcode that is typically present in the instructions of the binary data file(s) of a particular software package. One exemplary instruction format dictionary 16 is depicted in FIG. 3A. Each entry has an index code 52, shown as 1, 2, 3, 4 or 5. An opcode column 58 is provided for listing the opcodes.

An extended opcode 64 is the opcode and may further include additional code segments that modify the parameters associated with the opcode e.g. prefix(es), ModR/M, and the like. Each extended opcode is associated with a unique list of parameter types, or no parameters. The individual segments of the extended opcode may be stored in a separate column in the dictionary. For example, at times one or more than one prefix may be attached to different opcodes to form extended opcodes, each of which may be considered as a single opcode for purposes of the dictionary entry and entered under the prefix column 56 of the dictionary. As illustrated in the representation, the entry specified by index code "3" includes the opcode "02" and has a prefix of "0x64." Similarly, the entry having index code "4" has prefixes of "0x64" and "0x66."

At times, a ModR/M may be considered as a component of the extended opcode, where the ModR/M is a special value that implies a custom parameter list that is different from the generic case. A ModR/M can be part of the extended opcode, may have its value specified under a separate ModR/M column 60. For example, in FIG. 3A, the entries having index codes of "3", "4" and "5" have an extended opcode with a ModR/M of "0x6E". However, where a ModR/M doesn't affect the list and types of parameters following the opcode, the ModR/M is usually considered to be a parameter itself and its value may be entered in a parameter type column 62.

The parameter type column 62 in the instruction format dictionary is provided to describe the exact list of parameter types associated with a specific opcode or extended opcode. Any type of parameter may be denoted, depending on the characteristics of software package being processed. For example, the parameter type may be an immediate value, an offset, SIB, a register index, any parameter that described a command options or a command addressing mode, etc.

In addition, the instruction format dictionary may have columns to reference other components that may be present in an instruction or commonly occurring types of special parameters. For example, the dictionary may include a column for a parameter having a value that may modify the type and count of other parameters associated with an opcode, e.g. a ModR/M column for listing a ModR/M byte. A ModR/M byte may be provided in an instruction when its value can influence the number and type of parameters that follow it in the instruction stream, e.g. when an addressing mode is referring to an SIB byte. Furthermore, an analysis data column 64 in the dictionary may be included to store data that is used in analyzing the instruction stream or results from such analysis.

Figure 2A:
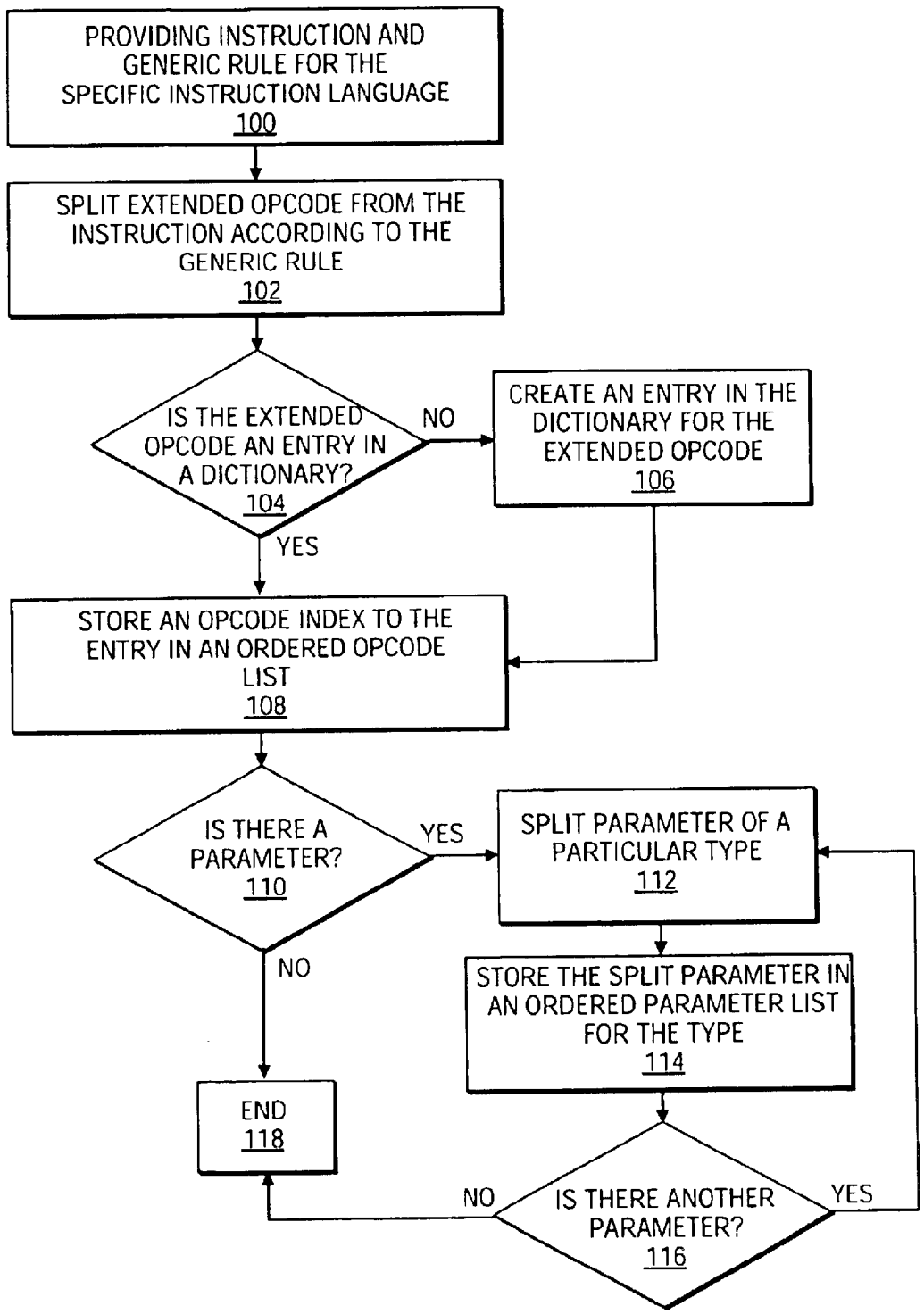
Figure 2B:
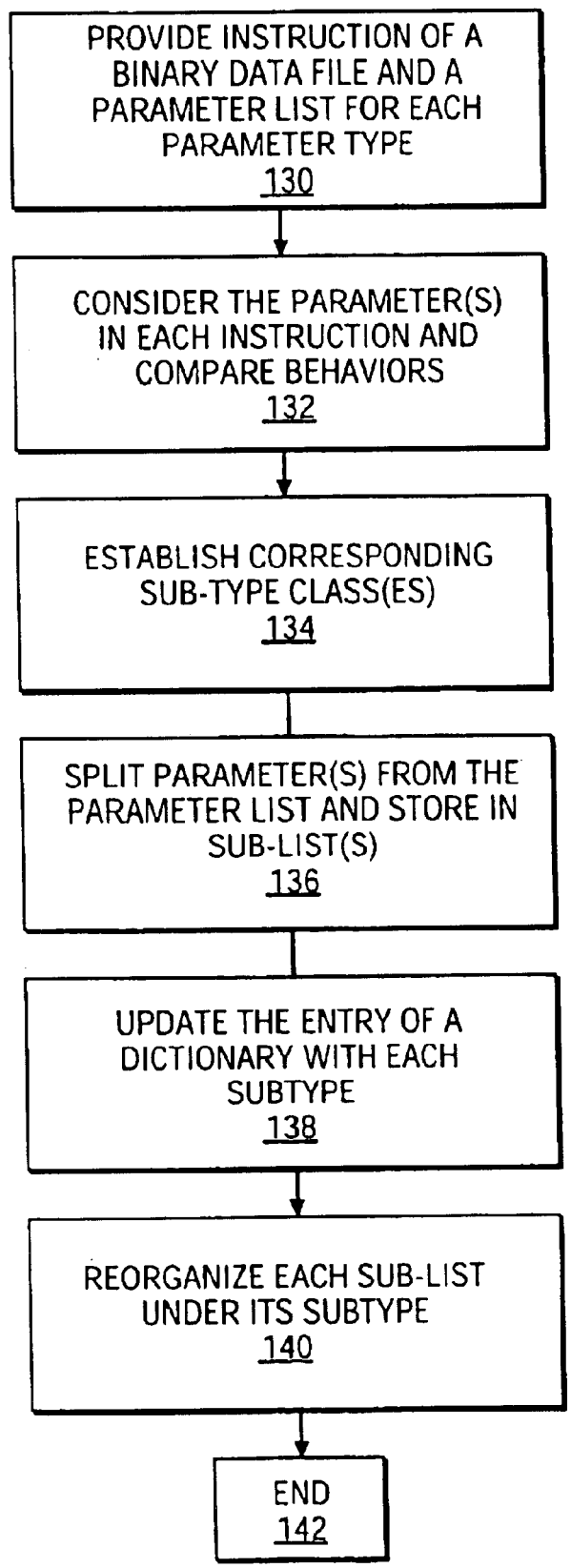

FIG. 2A is a flow diagram showing a process to split code sections into ordered lists according to the present invention. An instruction and the rule(s) are provided 100. An extended opcode in one of the instructions of an instruction steam in a binary data file is split from the instruction 102. The extended opcode is split in a manner that allows the original instruction stream to be later restored, e.g. through a bijective transformation process. The instruction format dictionary is scrutinized to determine whether the extended opcode has a corresponding entry in the dictionary 104. Usually, each segment of the extended opcode is incrementally compared to the entries of the dictionary. For example, where an instruction has opcode x, and segments y1, y2 and y3, the opcode x is first compared to the entries and a matched set of entries (which may comprise one or more entries) is identified. Next y1 is taken and compare to the matched entry/entries to identify a closer matched set of entries. This comparison procedure is repeated for each individual segment, e.g. y2, until a single matched entry is located. Then no further segments, e.g. extended opcode segments, parameters, etc. of the instruction, if any, need to be read. The remainder of the instruction is assumed to follow the exact parameter types list defined in the dictionary entry. For example, where x, y1 and y2 are found collectively to be defined as an extended opcode in a dictionary entry, then it is assumed that y3 parameter of a specific type follows, even if only x, y1 and y2 have been read.

If the extended opcode does not have any corresponding instruction format dictionary entry, then an entry for the extended opcode is created either in this main dictionary or in a secondary dictionary 106. A complete description of the extended opcode is associated with the exact list of parameter types, e.g. offset, immediate values, Mod R/M, SIB, etc. Furthermore, the opcode index code for the entry is placed in an extended opcode list in the order in which its instruction occurs among the other instructions (if any other instructions are present) in the binary data file 108.

Where the instruction does not include a parameter 110, the procedure ends. 118. Otherwise, if the instruction includes a parameter 110, the parameter is split from the instruction 112 and identified as being of a particular type, based on the parameter type in the associated instruction format dictionary entry. The parameter value is stored in a parameter list that is specific for the type in the order in which the instruction having the parameter occurs in the binary data file 114. In one specific case, an instruction a "switch" C primitive is implemented by a jump table directly hard coded in the middle of the instruction stream. Such a table is identified and the offsets stored in a parameter stream entitled, "jump table offsets." The splitting of parameters is performed for each parameter in each instruction of the data file until all parameters are stored in an appropriate ordered parameter list 116, and then ends 118.

Another procedure for organizing parameters is by organizing them according to behavioral patterns by statistical analysis of the binary data. Usually this analysis involves considering the entire software package or several files of the package. The use of a larger sample size in the analysis permits more consistent patterns to be observed leading to improved regularity of the processed data and increased compression ratios. The analysis is performed on all parameter values of a given parameter in an instruction format dictionary entry, i.e. each opcode. By observing all of the values used for a parameter, it is possible to determine that a parameter behaves like a particular subtype.

A subtype class is established by comparing the statistical analysis of all parameters of a particular type for all entries.

At times, the actual behavior does not need to be identified, but rather assumed by certain observed traits. For example, a specific size, e.g. 4 bytes, or range of lengths of parameters may be observed and an assumption may be drawn that the size represents a fundamental property of the instruction stream. Thus, one subtype may be developed to that size and another subtype to any other size. The crushing unit 14 may include an analysis module 32 for these purposes.

In order to classify parameters consistent with their behavior characteristics, a binary data file having at least one instruction may be provided 130. In one embodiment shown in FIG. 2B, a parameter list, such as a list based on parameter type as described above in reference to FIG. 2A, is also provided for each type of parameter in the instruction(s) 130. Each parameter in an instruction is analyzed for its characteristic behavior 132. This behavior is compared to the properties of other parameters in the remaining instructions of the data file 134. For example, a statistical graph may be generated for the range of values used most often in the software package. A strong pattern may be indicated by a high percentage of observed characteristics, e.g. a 98% or better occurrence. The subtypes for parameters having similar behavior signatures are identified 134 e.g. parameters that are used within instructions in the same or similar way. Some examples of subtypes include size of the parameter; the sign of the parameter value, e.g. positive, negative or mix of signs; the number of bits required to store the parameter, e.g. 1 it for values between 0 and 1, 2 bits for 2 to 3, 3 bits for 4 to 7, etc.; module $2^n$ class, e.g. 1 modular 8 classes are 1, 9, 17, 25, etc., 3 modular 4 classes are 3, 7, 11, 15, etc.; and the like; or combinations thereof. The similar parameters are split from their respective parameter list and placed into a sub-list for the subtype class 136.

For each subtype class identified, the parameter type information under the parameter type column of the instruction format dictionary is updated 138 to distinguish between subdivisions. The parameter type value in an entry is replaced with a value for the subtype. Each sub-list is also reorganized under its particular subtype 140, and the procedure ends 142.

In alternative embodiments, each parameter may also be considered by the analysis module to identify a random use property. Such parameters are dissimilar from other parameters and do not match a subtype. This parameter having a random use property may be split from its parameter list and stored in a dissimilar sub-list for random use properties. The instruction format dictionary may further be updated with the dissimilar sub-list. By separating the randomly behaving parameters from the instruction stream, the noise may be concentrated into a single list, resulting in greater regularity for the remaining instruction components and allowing an overall higher compression ratio.

In one detailed example of decomposition of parameters by behavior observation, two different statistical analysis models are employed, where one is for large displacement parameters (2 and 4 bytes) and another is for small parameters (1 byte). The large parameter model uses eight categories indicating parameters that have values within a specified range and having positive or negative signs. In this case, large displacements are offset relative to a reference pointer. The following are the eight large parameter categories:

less or equal to (−)0x01000000;

between (−)0x00ffffff and (−)0x000110000 (included);

between (−)0x0000ffff and (−)0x000100 (included);

between (−)0x000000ff and (−)0x0001 (included);

between (+)0x00000000 and (+)0x000000ff (included);

between (+)0x0000100 and (+)0x0000ffff (included);

between (+)0x00010000 and (+)0x00ffffff (included); and greater or equal to (+)0x01000000.

The small parameters are commonly used as increment, test mask, small offset or any other small index. It is observed that most of the small parameters have values that exhibit regular pattern "modulo 4." The following are four categories for the small parameters:

equal to 0 modulo 4;

equal to 1 modulo 4;

equal to 2 modulo 4; and equal to 3 modulo 4.

The results of statistical analysis reveals a few commonly used instructions and having specific behavior. The parameters for these common instructions are described by the following:

Addition or subtraction immediate on the stack pointer is often used to adjust the stack pointer after a function call by using a few different values, e.g. mostly multiples of four;

Pushb immediate is often used to push immediate parameters before a function call and by using mostly a few different values, e.g. many small numbers;

jmp and jcc, i.e. jump if condition is met, behave in a highly random fashion and without any visible pattern; and Call access is mostly a limited set of aligned addresses that is in local code or in a link table.

For the instructions that are not found to be commonly used or that fail to have specific pattern behavior, their parameters are sorted into two parameter lists as follows:

More than 94% of offsets equal 0 modulo 4, and

Any others.

In addition, some displacement 4 byte parameters are distributed among the following two parameter lists:

More than 94% of offsets are positive;

More than 94% of offsets are negative; and

Any others.

Furthermore, immediate 1 byte parameters are distributed among two parameter lists:

More than 75% of value equal to 0 modulo 4, and

Any others.

As a result of the above example of decomposition by behavior characteristics, the initial eight parameter lists are subdivided into 18 parameter lists. The decomposition procedure may greatly reduce the size of an instruction, e.g. ⅓ of the original stream. For example, in the example above, where a call access parameter is determined to be addresses in local code, the offset used by the call instruction may be replaced by the index of the function called in the binary. Where the parameter is an address in a link table, the offset may be substituted with the index of the entry in the link table. Thus, the range of values used to represent the address called may be abridged and may increase the compression ratio for subsequent compression of the binary data.

Figure 4:
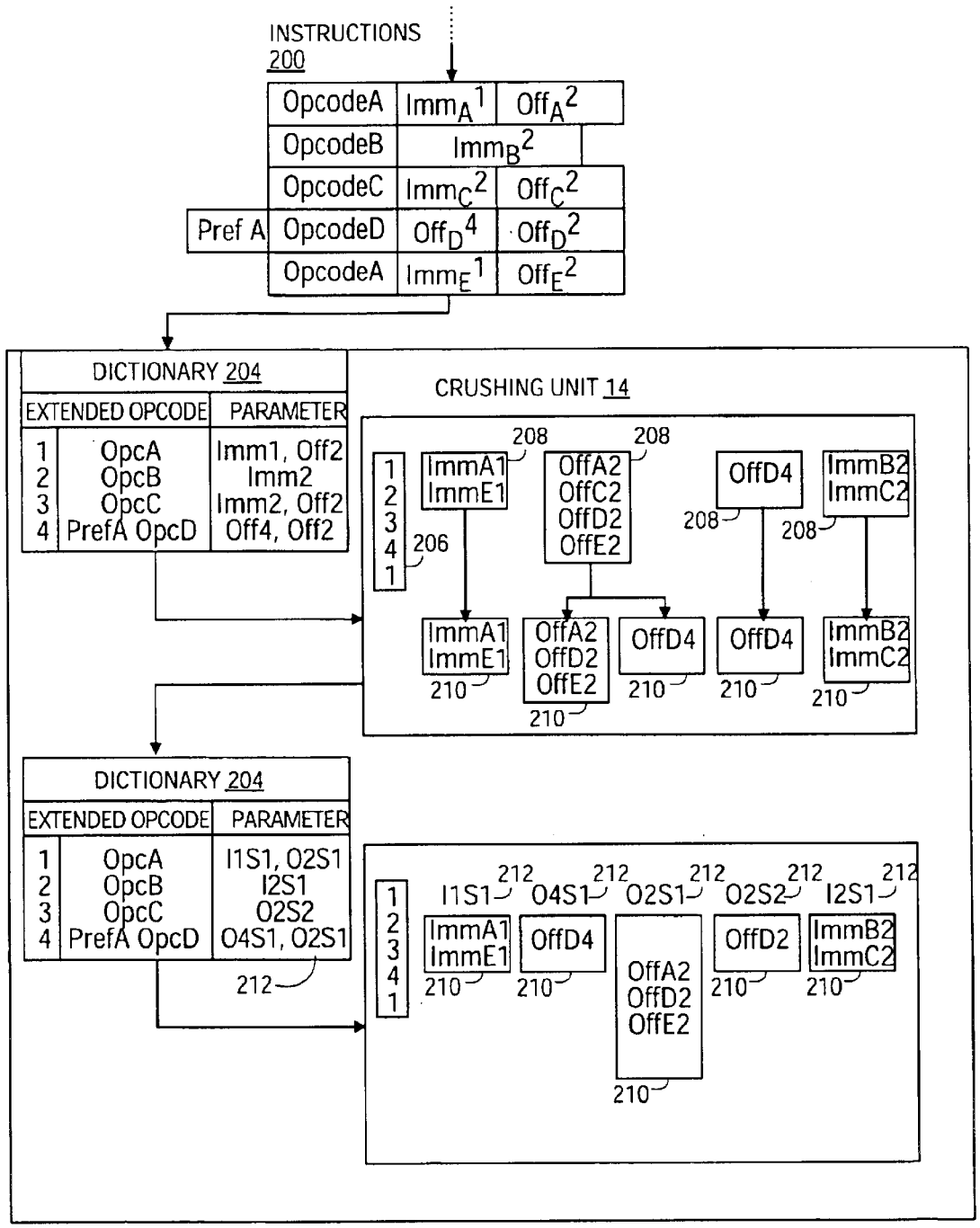
FIG. 4 illustrates one method of organizing binaries in an exemplary executable file, in accordance with the teachings presented herein.

One specific example of decomposition of instructions is illustrated in FIG. 4. The instructions 200 consist of opcodes associated with various types of parameters. In order in which the instructions occur: Opcode A has parameter types "Imm1, Off2"; Opcode B has parameter type "Imm2"; Opcode C has parameter type "Imm2, Off2"; Opcode D with Prefix A has parameter type "Off4, Off2"; and Opcode A has parameter type "Imm1, Off2". In this example, the parameter "Imm" stands for an immediate constant and "Off"

defines an address offset. These instructions are processed by a crushing unit 202. The opcodes are looked up in an instruction format dictionary 204 and an entry is found for each opcode. The associated index code for each entry is placed into an ordered opcode list 206 in order of its instruction in the data file (1, 2, 3, 4, 1).

In addition, the parameter type associated with every opcode is identified and grouped into an ordered parameter list 208 for each type in the sequence in which the instruction having the parameter is found in the instruction stream of the data file: "ImmA1, lmmA2"; "ImmB2, ImmC2"; "OffA2, OffC2, OffD2, OffE2"; and "OffD4".

These parameters are further analyzed to determine behavior characteristics in the context of the instructions in the data file. Where a behavior pattern is found to indicate that a particular parameter "OffC2" has a subtype characteristic that is different from the other parameters in its parameter list "OffA2, OffD2, OffE2", that parameter is split from the parameter list and placed into a separate sub-list 210. The parameters in the entries in the instruction format dictionary 204 are updated with values for the sub-list type 212. With this update, the entries of the dictionary include OpcA (I1S1, O2S1); OpcB (I2S1); OpcC (O2S2) and PrefA, OpcD (O4S1, O2S1). Each sub-list 210 is also placed in locations under its subtype (Subtype 1 and Subtype 2) 212 to create more efficient organization of the parameter sub-lists.

Renaming and Eliminating Binary Data File Component

According to the present invention, the names of various symbols in the binary data across the software package may be shortened. A symbol name is a stream of bytes that identify a dynamic link symbol, which may be useful in matching an export symbol with an import symbol. In the process, the properties of symbol names among binaries are preserved. The symbols are renamed in a manner that allows for future integration, modification or removal of any binary without the necessity of repeating the entire renaming process.

The symbols are bytes of variable lengths and may take various forms. A symbol may be a function, variable, a structured list of instructions or data, etc. The particular form of the symbol is often based on the binary file format used by the operating system, type of software languages, specific compiler used to create the components of the binary file, and the like. In one example, the symbol name in a mix of C, C++ and assembly language is a human readable text string that may be up to many hundred bytes in size and may be reduced to just a few bytes by the present renaming process.

Figure 5A:
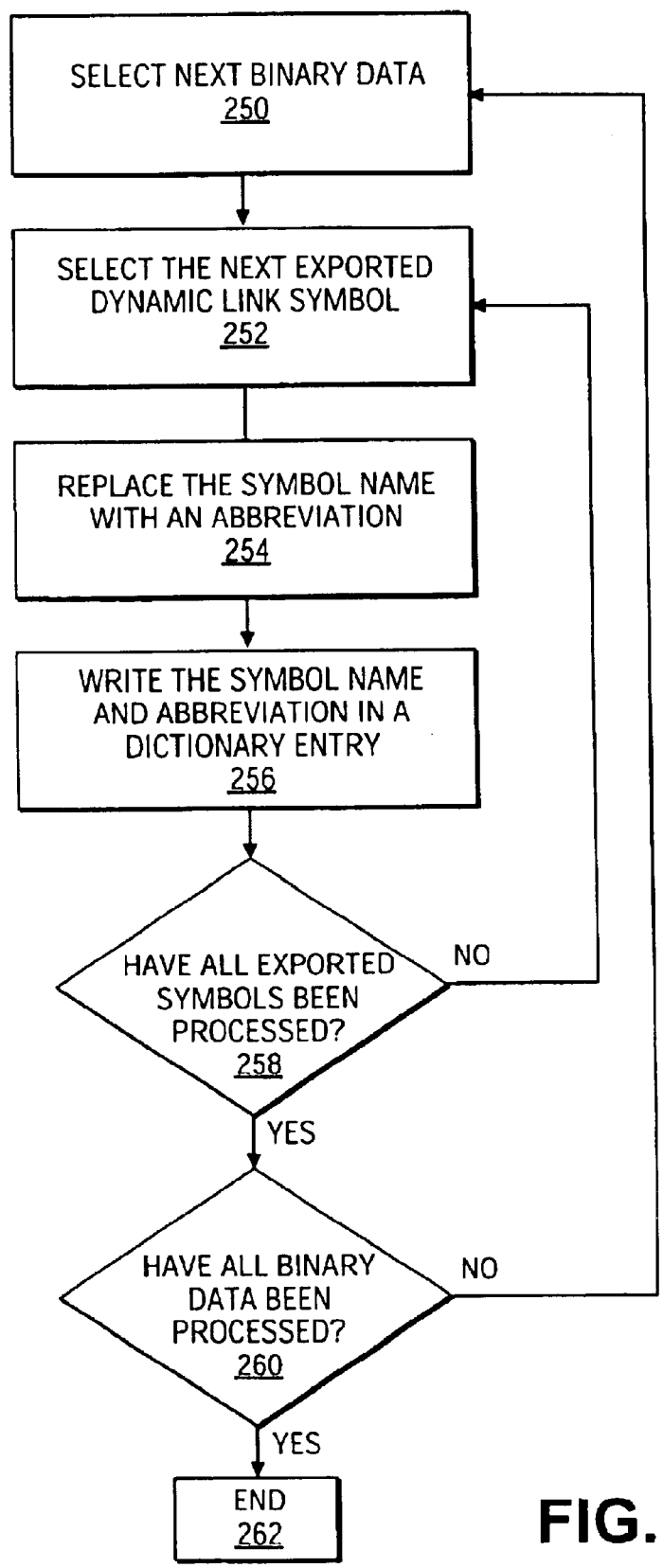

A renaming module 34 of the crushing unit 14 renames symbols into shorter abbreviations. One method for renaming symbols is illustrated by the flow charts in FIGS. 5A and 5B. During a first pass, as shown in the example process in FIG. 5A, the symbol names are indexed. Usually the indexing is performed system wide for all symbol names, i.e. applied to all binaries of the entire software package. A binary data file is selected from the software package 250 and an exported dynamic link symbol is chosen 252. Exported symbols indicate resources defined in the file and are made visible to other files. The symbol name for this chosen symbol is abbreviated 254. The abbreviation is smaller than the symbol name. The abbreviation size should also permit the desired number of symbols within a given software package to be abbreviated. Often a 2-byte string system is employed, e.g. supporting 255×255 different symbols, where one byte may have 256 different values plus null ( ) reserved as a terminator (C-string convention).

Both the symbol name and abbreviation are specified as an entry in a symbol dictionary 256. Each export symbol is processed in this manner 258 and the process repeats for all appropriate symbols in binary data files 260 and then ends 262.

Figure 6:
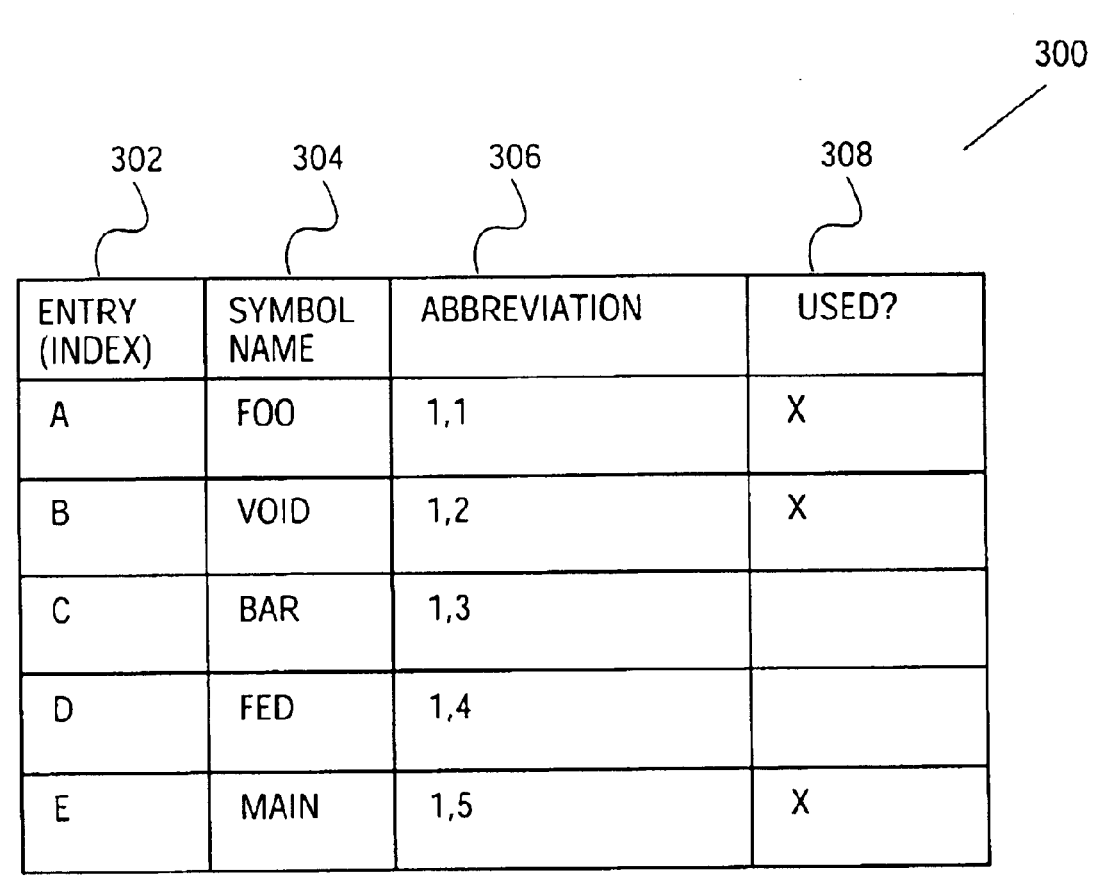

The symbol dictionary is a database that associates a symbol, a symbol name, an abbreviation name and the use status of the symbol. Typically, the symbol dictionary is created during the renaming process, where each symbol is added as an entry in the dictionary. However, a symbol dictionary with symbol names may already be provided. One example of a symbol dictionary 300 is depicted in FIG. 6. The symbol index code column 302 is useful in providing an index code for each symbol entry. The symbol name column 304 is for specifying the associated symbol name for each exported symbol. For example, the values: foo, void, bar, fed and main are presented. The abbreviation column 306 is provided for denoting the assigned abbreviation. A use status column 308 is also presented to signify the use or no use of a symbol within a particular binary data file. The symbol dictionary is often independent of an instruction format dictionary. However, the symbol dictionary and instruction format dictionary may also be merged into one instruction processing dictionary. Furthermore, the dictionary is usually extendable for later inclusion of a new dynamic like symbol as an entry.

A binary data file sometimes also includes exception symbols that are directly accessed in the instruction stream by the binaries of a file during its execution and not just at linking times. These exception symbol names are not referenced by link tables. The symbol names should not be abbreviated. In one embodiment, any exception symbol names are published in an exception symbol list and are not modified.

Figure 5B:
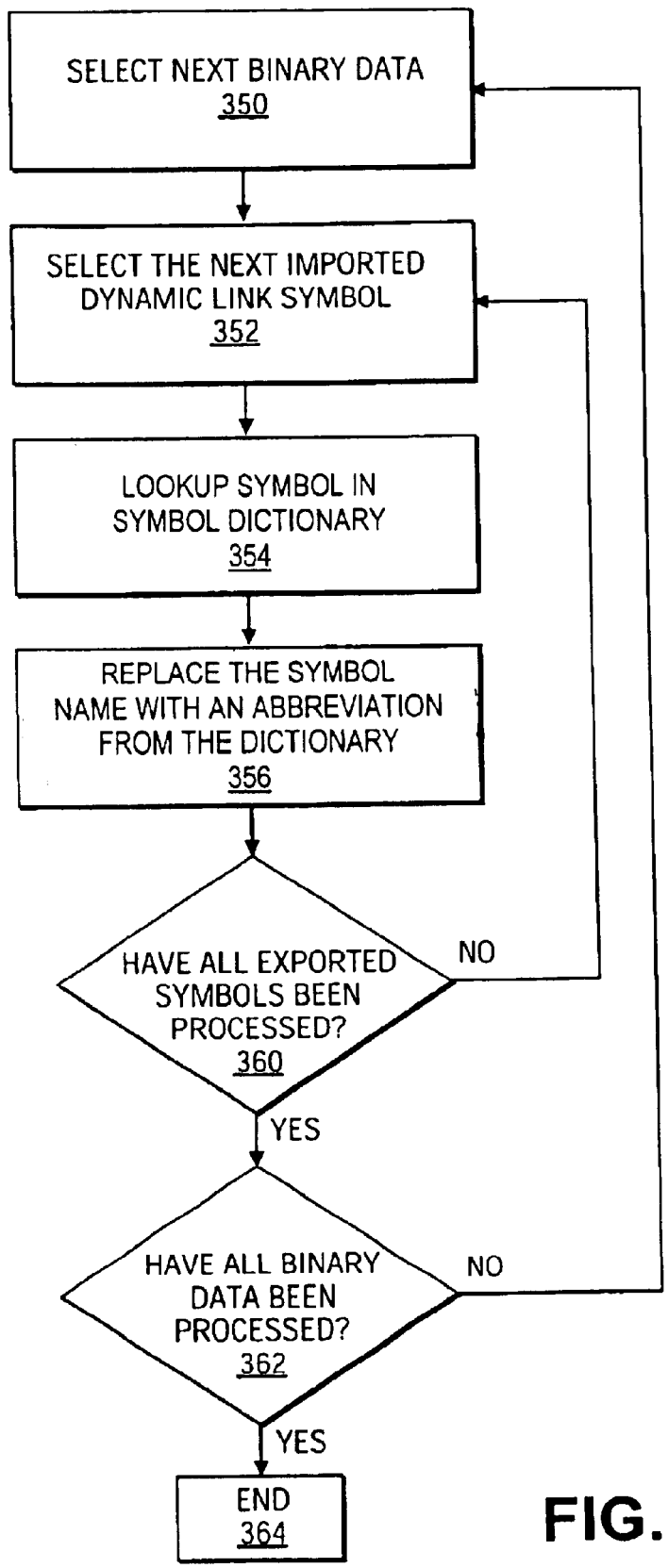

In addition to renaming of export symbols, all import dynamic link symbols may be processed in a binary data file, as shown in FIG. 5B. A binary data is selected 350 and an import symbol of the data file is chosen 352. The import symbol is looked up in the symbol dictionary 354. Once the corresponding entry in the dictionary is located, the symbol name in the binary file is replaced with the associated abbreviation 356 found in the dictionary entry. The process is repeated for processing all import symbols 360 and for all binary data 362, and then ends 364.

Figure 7A:
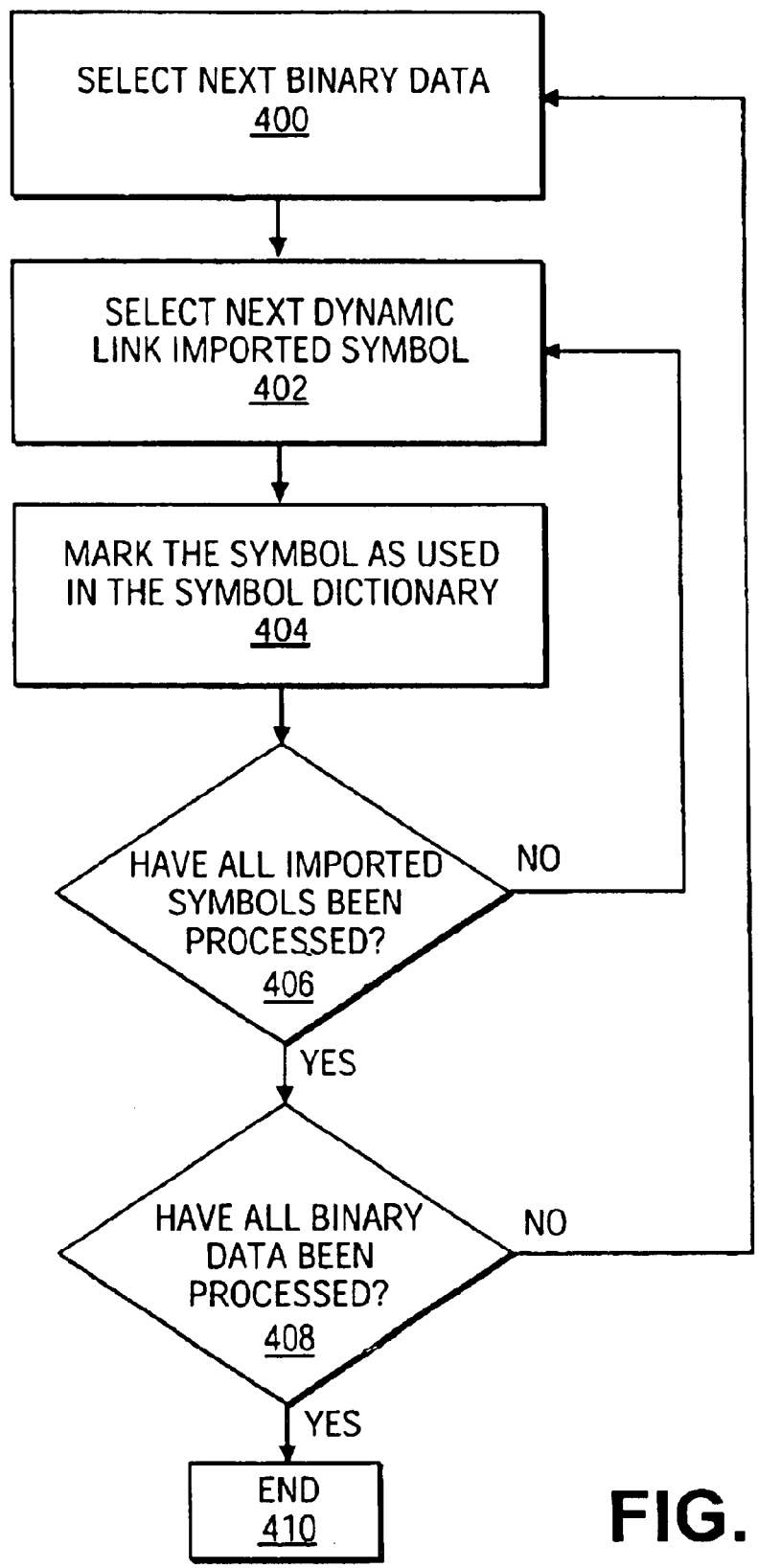
Figure 7B:
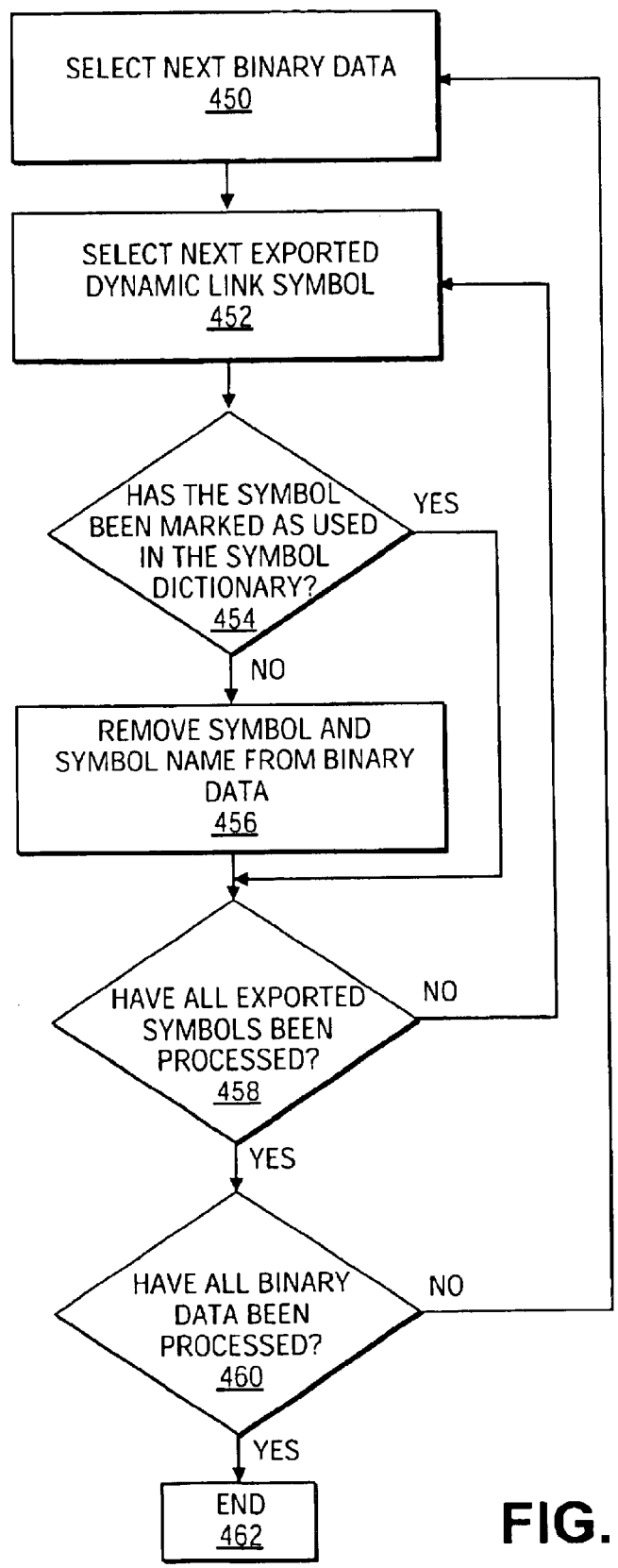

The crushing unit 14 may further have an elimination module 36, to eliminate unneeded data file components. The present invention provides optional methods for removing unused symbols, as illustrated in FIGS. 7A and 7B. Symbol elimination is usually conducted system-wide, where individual binary data files are selected 400 and identified as used or unused, as shown in FIG. 7A. Each imported dynamic link symbol of the data file is chosen 402 and marked as used in the corresponding entry for the symbol in the symbol dictionary 404 under the used status column. The process is repeated for each imported symbol 406 and for all binary data files 408 and then ends 410.

The notation of use status for the symbols in the symbol dictionary may be employed in the symbol elimination process, as shown in FIG. 7B. Each individual binary data File is selected 450 and each exported dynamic link symbol is chosen 452. The entry corresponding to the symbol is looked up in the symbol dictionary and it is determined whether the symbol is marked as used 454. Where the symbol is not marked as used, the symbol and symbol name is removed from the binary data 456. However, if the symbol is marked as used, the symbol is preserved. This process is repeated for each next exported symbol 458 and for all binary data 460, and then ends 462.

Where the entries of the symbol dictionary specifies the binary that exports the symbol, eliminated export symbols may be thereafter restored, such as cases in which the use status changes from unused to used. The new symbol may be generated by accessing the unused symbol name from the unused symbol dictionary. Furthermore, the symbol dictionary may be updated with the changed use status by modifying from unused to used in the appropriate entry.

Figure 8:
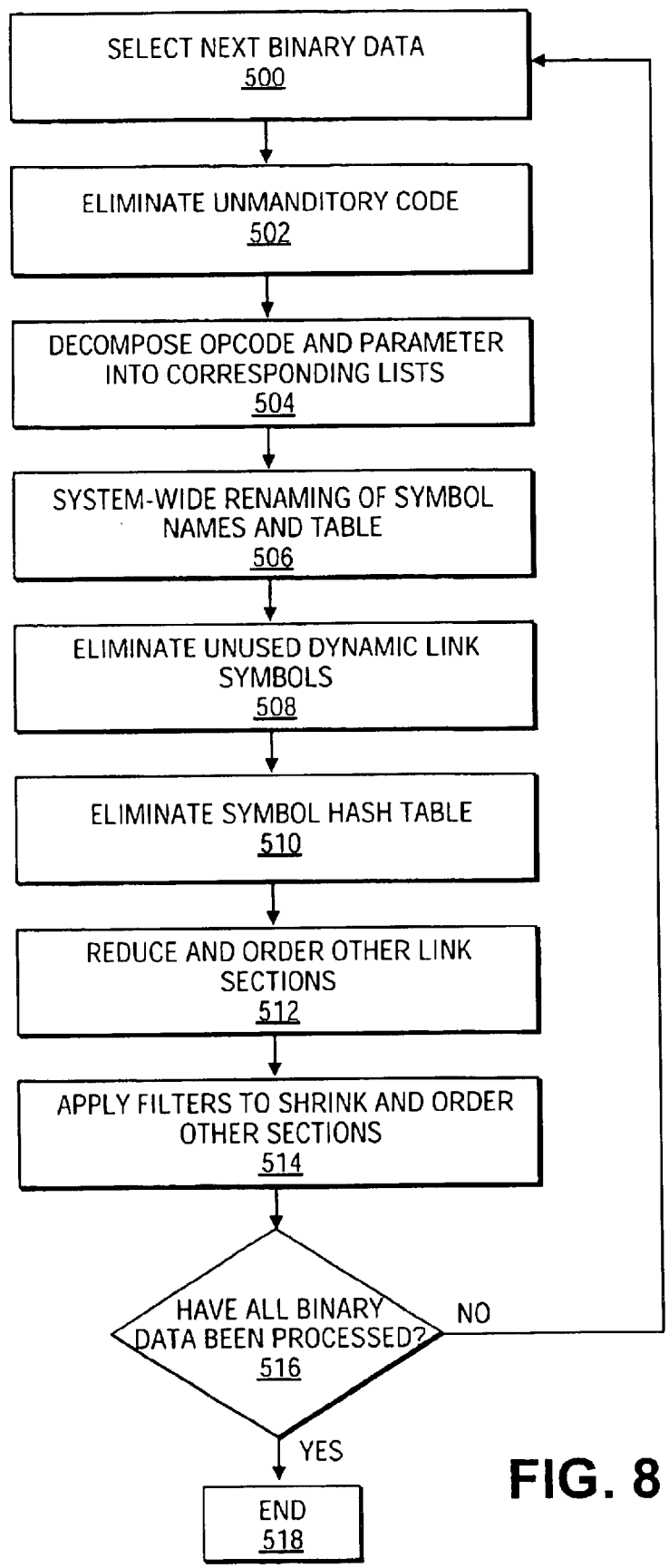
FIG. 8 is a flow chart of one exemplary global optimization of a software package, according to the teachings presented herein.

The above steps may be implemented in various ways on a software package. The processing is especially applicable where a binary data file is written and then loaded as a single raw block of data. An example of global optimization, as shown in the flow chart in FIG. 8, considers patterns that exist between multiple binaries. Each instruction of a binary file is presented 500. The sections that are not mandatory for loading the executable into memory, such as debugging information are eliminated 502. In general, any other section(s) that may be dynamically generated based on other information and general rules common to all binaries can be eliminated e.g. as described with regards to FIG. 2B.

Sections of code are reduced by decomposing instructions into the appropriate opcode and optionally parameter lists 504, as described above with regards to FIG. 2A. However, where decomposition does not significantly reduce code size, e.g. if the section is very small, then the decomposition step may be skipped. In addition, symbol table and symbol names may be reduced by using the system-wide renaming 506 and elimination of unused dynamic link symbols described above 508, with regards to FIGS. 7A, 7B, 5A and 5B. Consequently, a symbol hash table for matching import symbols with export symbols may be eliminated 510. If the hash table is desired in the future, it may be regenerated based on the symbol dictionary.

Furthermore other link sections may be updated to be consistent with prior changes 512. For example, symbol names are typically stored in particular sections in the binary data file and references to the symbol names, such as pointers and offsets, indicate the position of the symbol relative to other sections. However, as a result of renaming or eliminating of symbols, the references may be incorrect and must be adjusted to correctly refer to the symbol names.

In addition, custom filters may be applied to a variety of code sections to increase their regularity and shrink their size 514. For example, a filter may process relocation sections to reduce size and increase regularity by reordering specific bytes, e.g. delta encoding. Normally, these relocation sections include lists of entries, such as offsets and properties, and their function is not affected by the order in which they occur. The filter may sort the entries in increasing order of small to larger. The first entry, e.g. offset, is preserved and each subsequent entry is replaced with the difference of the entry with the immediately prior entry. This ordering and resizing of entries, e.g. offsets, allow for more efficient encoding.

Figure 1B:
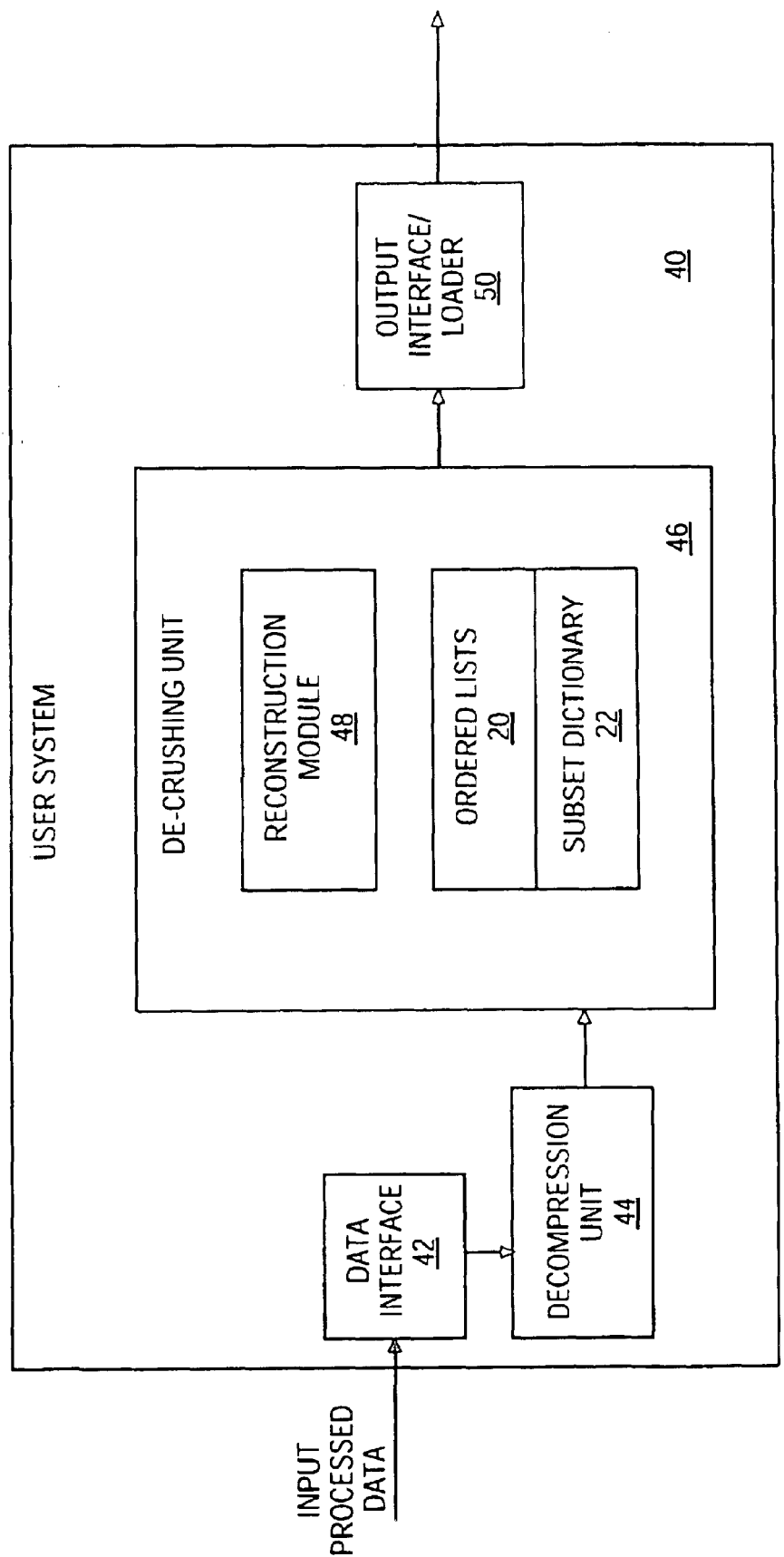

Once the data is processed and organized, subset(s) of the data may be extracted. In one embodiment, the crushing unit processing system may form a subset dictionary 22 based on the full information format dictionary and/or symbol dictionary as shown in FIG. 1B. The subset dictionary 22 has at least the basic information that is needed to reconstruct an instruction. One type of subset dictionary has information to associate each opcode of a binary file with at least one ordered list, e.g. opcode list, parameter list, and the like. FIG. 3B depicts an example of this type of subset dictionary 22 based on instruction format dictionary 16 shown in FIG. 3A described above and the ordered lists shown in FIG. 3C.

The subset dictionary 22 has an index column 72 for listing each entry index from the instruction format dictionary, an extended opcode column 74 for entry of each extended opcode and a parameter list index column 76 to specify the parameter index associated with the extended opcode of the entry. This subset dictionary 22 and the ordered lists 20, e.g. opcode list, parameter list, etc., are transferred to a remote user system that may convert this processed data into a useable format that represents only relevant portions of the original instruction streams. In this situation, usually the user does not receive the full instruction format dictionary and symbol dictionary, so that unauthorized users do not readily have access to the full original instruction streams. For instance, the subset dictionary may not include analysis data that may have been used in arranging the data. Thus, it is difficult for a user of the subset dictionary to determine the steps that led to such data organization and the vulnerability to undesired hackers is reduced.

Further to the components of the processing system, a block management system 24 may be provided for assembling the individual data from the crushing unit 14 into desired form for further processing, e.g. compression. For instance, the block management system may relate the blocks of data to create a single unit of data.

Typically, the processed data is compressed by applying various convenient algorithms that allow data files to shrink by compressing the data. As shown in FIG. 1A, the processing system 10 may have a compressing unit 26 to further condense the data. Low compression schemes (i.e., those that do not provide significant compression ratios) that may be used include joint photographic experts group (JPEG) compression schemes that use Fourier analysis-based methods, such as the discrete cosine transform, to compress data; graphics interchange format (GIF) compression schemes, which use LZW algorithms; bitmapped image compression schemes and tagged image file format (TIFF) compression schemes. Alternatively, high efficiency compression schemes, such as wavelet, motion wavelet, Motion Picture Experts Group (MPEG) and/or motion JPEG schemes may be employed. Use of such high efficiency schemes may be preferred where storage space and/or transmission bandwidth is limited. For example, wavelet compression schemes may be 20 times more efficient than JPEG compression schemes, providing for a more detailed representation of the data at the same bit budget.

A storage unit 28 may store the compressed and/or processed data until ready for use. The storage may be a dynamic random access memory (DRAM) and/or may include static RAM (SRAM). There may also be other types of alternative storage areas that may be considered as part of the storage or separate from the storage. Such alternative areas may include cache, flash memory, and removable storage.

Often the treatment computational system has components to send the resulting processed data, or portions thereof to a user system. The processed data must be de-processed prior to its use. In one embodiment, a user system 40 is employed to prepare the processed data for user application as shown in FIG. 1B.

The user system 40 has a data interface 42 for receiving the processed data from the processing system 10. Similar to the processing system, the user system may be any electronic device to receive data and manipulate the data to generate a processed binary data in the manner described herein, e.g. a computer system or workstation. The system may be other intelligent devices, such as telephones, e.g. cellular telephones, personal organizers (PDA's), pagers, and other wireless devices. The devices listed are by way of example and are not intended to limit the choice of apparatuses that are or may become available in the computational device field that may use binary data, as described herein.

In one embodiment, the processed data received by the user processing system is a subset of the processed data is transferred to the user system. The subset may comprise organized data lists 20 and a subset dictionary 22, such as the subset dictionary described above in reference to FIG. 3B.

Where the processed data had been previously compressed, a de-compression unit 44 is also provided. Furthermore, a de-crushing unit 46 restores the data so that the data may be used. In the case that the data is in the form of a subset dictionary and ordered lists, the de-crushing unit reads each entry of the subset dictionary, as in FIG. 3B and refers to the appropriate ordered list, as exemplified in FIG. 3C. For instance, for index "1", the extended opcode "01" is coped to an output. Then list "1" is read and parameter value "$Imm_1$ 1" is copied. List "7" is read and "$Offset_1 4$" is copied, followed by the reading of list "9" and copying of the value "$SIB_1$". Subsequently, the entry labeled index 2 is addressed; extended opcode 02 is copied; the list "1" read; the next value in the list "$Imm_2 1$" copied; list "7" is read and next value "$Offset_2 4$" copied; followed by reading of list 9 and copying of the next value in that list, "$SIB_2$". According to this pattern, entry 3 is read with extended opcode 64, 02, 6E copied followed by copying of "$Imm_3$ 1", and "$Offset_3 2$". In this manner all entries of the dictionary may be read to produce the data for use.

Upon review of this specification, it will be appreciated by those skilled in the art that the various components of processing system 10 and user system 40 may be connected in other ways in addition to those shown and described. In addition, in an alternative configuration, both the computational systems in FIG. 1A and FIG. 11B may be combined into a single system that has both a crushing unit 14 and de-processing unit 46.

Figure 9:
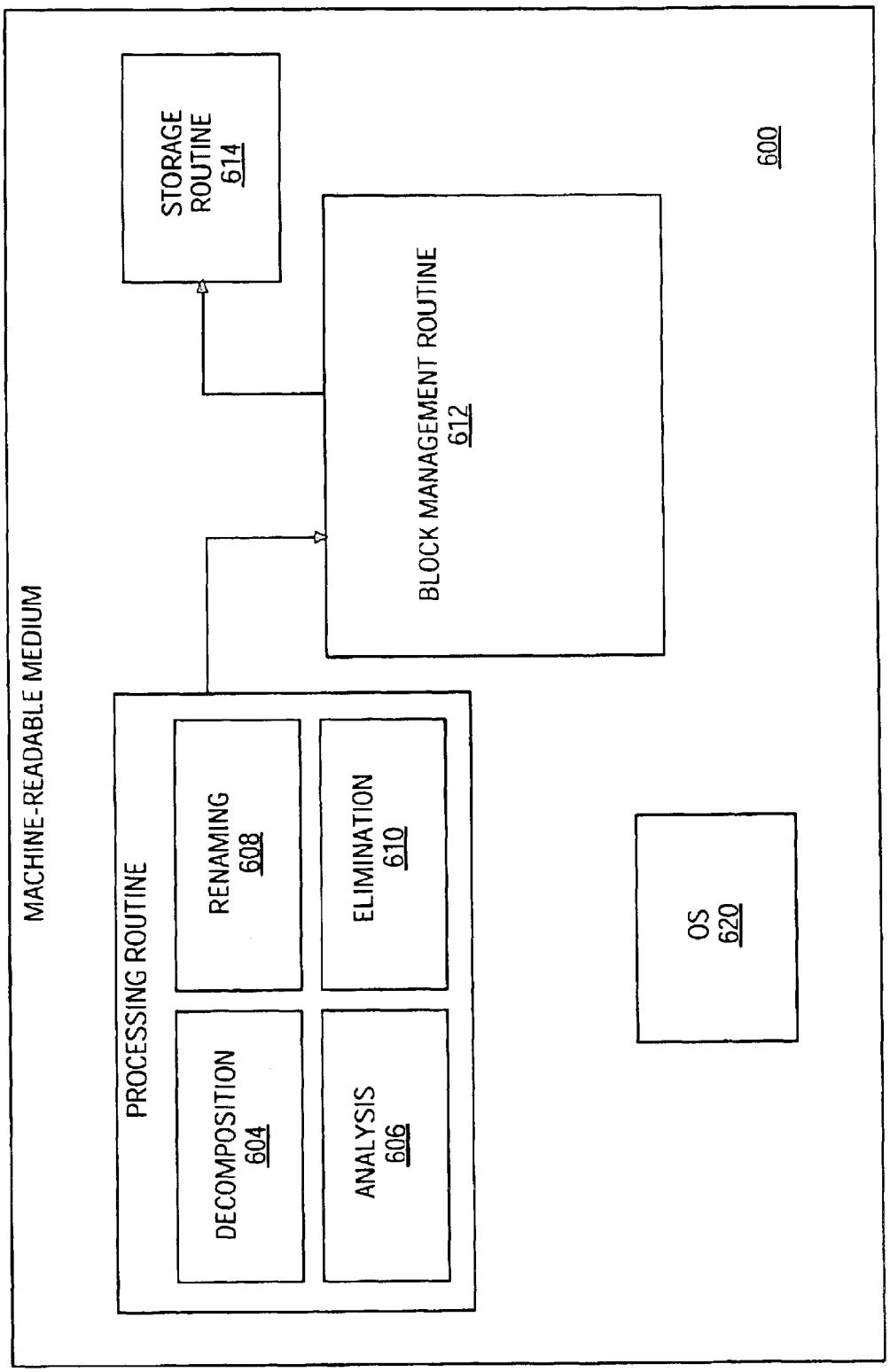
FIG. 9 is a block diagram of a machine-readable medium storing executable code and/or other data to provide one or a combination of mechanisms for processing and organizing binary data, in accordance with one embodiment of the present invention.

Various software components, e.g. applications programs, may be provided within or in communication with the system that cause a processor or other components to execute the numerous methods employed in processing and organizing the binary data. FIG. 9 is a block diagram of a machine-readable medium storing executable code and/or other data to provide one or a combination of mechanisms for reducing the size and/or ordering the form of the binary data, according to one embodiment of the invention. The machine-readable storage medium 600 represents one or a combination of various types of media/devices for storing machine-readable data, which may include machine-executable code or routines. As such, the machine-readable storage medium 600 could include, but is not limited to one or a combination of a magnetic storage space, magneto-optical storage, tape, optical storage, dynamic random access memory, static RAM, flash memory, etc. Various subroutines may also be provided. These subroutines may be parts of main routines or added as plug-ins or Active X controls.

The machine readable storage medium 600 is shown having a processing routine 602, which, when executed, manipulates binary data through any combination of various subroutines. The processing routine may be performed by a crushing unit 14 as shown in FIG. 1A. The subroutines may include a decomposition subroutine 604, such as described above with regards to the decomposition module 30 in FIG. 1A. Furthermore, an analysis subroutine 606 may be present to perform tasks described with regard to the analysis module 32. A renaming subroutine 608 may be provided to process symbols as described for the renaming module 34. Elimination subroutine 610 may also be provided to eliminate code sections as performed by eliminate module 36.

The medium 600 also optionally has a block management routine 612 for combining the processed data into a cohesive unit. The uniting of data is described above in regard to block management unit 24 in FIG. 1A. A storage routine 614 stores the processed data. In addition, other software components may be included, such as an operating system 620.

The software components may be provided in as a series of computer readable instructions that may be embodied as data signals in a carrier wave. When the instructions are executed, they cause a processor to perform the message processing steps as described. For example, the instructions may cause a processor to communicate with a content source, store information, merge information and output an audio message. Such instructions may be presented to the processor by various mechanisms, such as a plug-in, ActiveX control, through use of an applications service provided or a network, etc.

The present invention has been described above in varied detail by reference to the particular embodiments and figures. However, these specifics should not be construed as limitations on the scope of the invention, but merely as illustrations of some of the presently preferred embodiments. It is to be further understood that other modifications or substitutions may be made to the described information transfer system as well as methods of its use without departing from the broad scope of the invention. Therefore, the scope of the invention should be determined by the following claims and their legal equivalents.

What is claimed is:

1. A method for processing and organizing binary data, the method comprising:
   splitting an extended opcode from an instructions;
   storing an index code in an opcode list as reference to an instruction entry in an instruction format dictionary representing the extended opcode, wherein the index code is stored in the order that the instruction is provided in an instruction stream; and
   considering a parameter of the instruction to determine at least one of a similar use property of the parameter and a random use property of the parameter.

2. The method of claim 1, further including:
   splitting a parameter of a particular type from the instruction, and
   storing the parameter in a parameter list for the particular type.

3. The method of claim 2, further including repeating splitting of the parameter and the storing of the parameter, for another parameter.

4. The method of claim 2, wherein the particular type is an immediate value, an offset, or a register index.

5. The method of claim 2 wherein the parameter list is in a sub-list for the similar use property.

6. The method of claim 5, further including updating the instruction format dictionary with the sub-list.

7. The method of claim 5, wherein the considering is by applying rules specific to the binary data.

8. The method of claim 7, wherein the rules are formulated by statistical analysis of the parameters of a particular type in the entries of the instruction format dictionary.

9. The method of claim 5, wherein the similar use property is any one of a group including size, sign, number of bits required to store the parameter, and module $2^n$ class.

10. The method of claim 2 wherein the parameter list is a dissimilar sub-list for the random use property.

11. The method of claim 10, further including updating the instruction format dictionary with the dissimilar sub-list.

12. The method of claim 1, wherein the instruction entry includes at least one instruction prefix byte and opcode.

13. The method of claim 1, further including adding the extended opcode as an instruction entry in the instruction format dictionary.

14. A crushing unit for processing and organizing binary data, the unit comprising:
   a decomposition module to split an extended opcode from an instruction;
   an instruction format dictionary to store the extended opcode and an index code as an entry;
   an opcode list having the index code in the order that the instruction is provided in an instruction stream;
   an analysis module to consider a parameter in the instruction to determine a subtype of a similar use property of the parameter; and
   a dissimulation module to consider the parameter in the instruction to determine a random use property of the parameter.

15. The unit of claim 14, wherein the decomposition module is further to split the parameter of a particular type from the instruction and the crushing unit further includes at least one parameter list to store the parameter.

16. The unit of claim 15, wherein the type is any one of a group including an immediate value, an offset, and a register index.

17. The unit of claim 15, wherein the entry includes at least one instruction prefix byte and opcode.

18. The unit of claim 14, wherein the analysis module is further to split the parameter and the unit further including a sub-list to store the parameter with the subtype.

19. The unit of claim 18, wherein the instruction format dictionary is further to store the parameter subtype in the entry having the extended opcode associated with the parameter.

20. The unit of claim 14, wherein the considering is by applying rules specific to the binary data.

21. The unit of claim 20, wherein the rules are formulated by statistical analysis of the parameters of a particular type in the entries of the instruction format dictionary.

22. The unit of claim 14, wherein the similar use property is any one of a group including size, sign, number of bits required to store the parameter, and module $2^n$ class.

23. The unit of claim 14, wherein the dissimulation module further splits the parameter having the random use property and the crushing unit further including a dissimilar sub-list to store the parameter having the random use property.

24. The unit of claim 23, wherein the instruction format dictionary further includes the parameter having the random use property in the entry for the extended opcode associated with the parameter.

25. A computer readable medium having stored therein a plurality of sequences of executable instructions, which, when executed by a processing system for processing and organizing binary data, cause the system to:
   split an extended opcode from an instruction;
   store an index code in an opcode list as reference to an instruction entry in an instruction format dictionary representing the extended opcode, wherein the index code is stored in the order that the instruction is provided in an instruction stream;
   consider a parameter of the instruction to determine at least one of a similar use property of the parameter and a random use property of the parameter.

26. The computer readable medium of claim 25, further including additional sequences of executable instructions, which, when executed by the system, cause the system to split the parameter of a particular type from the instruction, and store the parameter in the parameter list for the particular type.

27. The computer readable medium of claim 25, further including additional sequences of executable instructions, which, when executed by the system, cause the system to store the parameter in a sub-list for the similar use property and in a dissimilar sub-list for the random use property.

28. The computer readable medium of claim 27, further including additional sequences of executable instructions, which, when executed by the system, cause the system to update the instruction format dictionary with the sub-list and the dissimilar sub-list.

29. A method for processing and organizing binary data in an executable file, the method comprising:
   replacing the symbol name corresponding to the dynamic link symbol in the binary data with an abbreviation that is smaller than the symbol name;
   writing the symbol name and abbreviation as an entry in a symbol dictionary; and identifying an unused symbol to export by the executable file and not to import by another executable file.

30. The method of claim 29, further including publishing an exception symbol name that is directly accessed by an executable during execution.

31. The method of claim 29, wherein the symbol dictionary is extendable to later include a new dynamic link symbol as another entry in the symbol dictionary.

32. The method of claim 29, further including eliminating a symbol hash table from the executable file.

33. The method of claim 29, further including:
   writing an unused symbol name associated with the unused symbol as an entry in the symbol dictionary; and
   eliminating the unused symbol and unused symbol name.

34. The method of claim 33, further including marking the unused symbol as unused in the symbol dictionary.

35. The method of claim 33, further including generating a previously eliminated unused symbol by accessing the unused symbol name from the unused symbol dictionary.

36. A crushing unit for processing and organizing binary data in an executable file, the unit comprising:
   a renaming module to replace a symbol name corresponding to a dynamic link symbol in the binary data with an abbreviation that is smaller than the symbol name;
   a symbol dictionary having an entry including the symbol name and abbreviation; and
   an elimination module to identify and to remove an unused symbol for exporting by the executable file and not for importing by another executable file,
   wherein the symbol dictionary further includes an unused symbol name associated with the unused symbol as an entry.

37. The unit of claim 36, wherein the renaming module is further to publish an exception symbol name that is directly accessed by an executable during execution.

38. The unit of claim 36, wherein the symbol dictionary is extendable to later include a new dynamic link symbol as another entry in the symbol dictionary.

39. The unit of claim 36, wherein the elimination module is further to remove a symbol hash table from the executable file.

40. The unit of claim 36, wherein the symbol dictionary further includes a notation of the unused status of the unused symbol.

41. The unit of claim 36, wherein the unused symbol name in the symbol dictionary is further to be accessible to generate a previously eliminated unused symbol.

42. A computer readable medium having stored therein a plurality of sequences of executable instructions, which, when executed by a processing system for processing and organizing binary data, cause the system to:
 replace the symbol name corresponding to the dynamic link symbol in the binary data with an abbreviation that is smaller than the symbol name;
 write the symbol name and abbreviation as an entry in a symbol dictionary; and
 publish an exception symbol name that is directly accessed by an executable during execution.

43. The computer readable medium of claim 42, further including additional sequences of executable instructions, which, when executed by the system, cause the system to:
 identify an unused symbol to export by the executable file and not to import by another executable file;
 write an unused symbol name associated with the unused symbol as an entry in the symbol dictionary; and
 eliminate the unused symbol and unused symbol name.

44. The computer readable medium of claim 43, further including additional sequences of executable instructions, which, when executed by the system, cause the system to mark the unused symbol as unused in the symbol dictionary.

* * * * *